United States Patent [19]

Anantha et al.

[11] 4,214,315
[45] Jul. 22, 1980

[54] METHOD FOR FABRICATING VERTICAL NPN AND PNP STRUCTURES AND THE RESULTING PRODUCT

[75] Inventors: Narasipur G. Anantha, Hopewell Junction; Harsaran S. Bhatia, Wappingers Falls; James L. Walsh, Hyde Park, all of N.Y.

[73] Assignee: International Business Machines Corporation, Armonk, N.Y.

[21] Appl. No.: 21,123

[22] Filed: Mar. 16, 1979

Related U.S. Application Data

[62] Division of Ser. No. 844,767, Oct. 25, 1977, Pat. No. 4,159,915.

[51] Int. Cl.² .............................................. H01L 27/02
[52] U.S. Cl. ................................... 357/44; 357/49; 357/50; 357/15; 357/92
[58] Field of Search .................. 357/44, 49, 50, 15, 357/92

[56] References Cited

U.S. PATENT DOCUMENTS

| | | | |
|---|---|---|---|
| 4,057,823 | 11/1977 | Burkhardt | 357/52 |
| 4,071,774 | 1/1978 | Tokumaru | 307/215 |
| 4,087,900 | 5/1978 | Yiannoulos | 29/578 |
| 4,101,349 | 7/1978 | Roesner | 148/175 |
| 4,156,246 | 5/1979 | Pedersen | 357/15 |
| 4,160,991 | 10/1979 | Anantha | 357/49 |

*Primary Examiner*—Martin H. Edlow
*Attorney, Agent, or Firm*—George O. Saile

[57] ABSTRACT

A method is given for fabricating vertical NPN and PNP structures on the same semiconductor body. The method involves providing a monocrystalline semiconductor substrate having regions of monocrystalline silicon isolated from one another by isolation regions. Buried regions are formed overlapping the juncture of the substrate and epitaxial layer and are located in at least one of the regions of isolated monocrystalline silicon. The P base region in the NPN designated regions and a P reach-through in the PNP designated regions are formed simultaneously. The emitter region in the NPN regions and base contact region in the PNP regions are then formed simultaneously. The P emitter region in the PNP regions is then implanted by suitable ion implantation techniques. A Schottky Barrier collector contact in the PNP regions are formed. Electrical contacts are then made to the PNP and NPN transistor elements. A PNP device may be fabricated without the formation of an NPN device if it is so desired.

12 Claims, 14 Drawing Figures

METHOD FOR FABRICATING VERTICAL NPN AND PNP STRUCTURES AND THE RESULTING PRODUCT

This is a division of application Ser. No. 844,767 filed Oct. 25, 1977, now U.S. Pat. No. 4,159,915.

BACKGROUND OF THE INVENTION

The invention relates to methods for fabricating vertical NPN and PNP structures on the same semiconductor body or alternatively PNP structures.

DESCRIPTION OF THE PRIOR ART

In the monolithic integrated circuit technology, it is usually necessary to isolate various active and passive elements from one another in the integrated circuit structure. These devices have been isolated by back-biasing PN junctions, partial dielectric isolation and complete dielectric isolation. The dielectric materials used have been silicon dioxide, glass, and so forth. The preferred isolation for these active devices and circuits particularly as integration density has increased is some form of dielectric isolation. The dielectric isolation has substantial advantage over the PN junction isolation because it allows the abutting of the circuit elements against the isolation and thereby results in greater density of packing of the active and passive devices on the integrated circuit chip.

Isolated pockets of monolithic silicon is the result of the isolation process described in the previous paragraph. Active devices, such as bipolar transistors, field effect transistors, and passive devices such as resistors, diodes, and so forth, may then be formed in these monocrystalline silicon pockets. The essential steps in the formation of silicon planar devices may be seen, for example, in the book "Modern Microelectronics" by Max Fogiel, published by Research and Education Assoc., 342 Madison Avenue, New York, N.Y. 10017, 1972 (See particularly pages 463–472). Briefly, the process involves obtaining, for example, a P substrate of silicon, oxidizing the surface, opening a window in the silicon dioxide using standard photolithography and etching techniques, diffusing an N+ buried region through the opening. The silicon dioxide is removed and an epitaxial layer of N-type silicon is grown thereover. During the epitaxial layer growth there is some outdiffusion of the buried layer into the epitaxial layer. The buried layer is destined to become the sub-collector of an NPN transistor in this example. Another silicon dioxide layer is grown on the surface of the epitaxial layer, openings for isolation diffusion in the silicon dioxide are formed by photoresist and etching techniques, and the isolation diffusion or dielectric isolation is formed to isolate pockets of monocrystalline silicon. Openings are formed in the silicon dioxide coating where the base of the NPN transistor is to be formed and any P-type resistors are to be formed, and a P-type diffusion forms PN junctions in the N epitaxy layer. The surface is reoxidized and the use of photolithography and etching techniques made to open the regions destined to be the emitter and the collector reach-through. The emitter and reach-through diffusions are made. The surface is again oxidized. Openings are made in the silicon dioxide mask using conventional photolithography and etching techniques for the ohmic contact purposes. The entire surface is metallized, such as with aluminum film, and using conventional photolithography and etching techniques, the interconnections are formed through the etching away of the metal film.

In the manufacture of integrated circuits wherein a plurality of PNP transistors and NPN transistors are to be formed on the same semiconductor body, there has not been a practical method for fabricating vertical NPN and vertical PNP transistors. Where such structures have been fabricated, there have been compromises in the electrical characteristics of the transistors. These compromises usually lead to low current gain and high saturation resistance for the PNP device. Such a PNP device is inferior in performance compared to the NPN device. Under one fabrication process, the fabrication of the NPN and PNP transistors by the double-diffusion process are fabricated successively. In such a process, the processing control would be very complex because of the undesirable movement of the earlier diffusions during the later diffusions.

Another approach to overcoming the problem has been to fabricate the NPN transistor and a lateral PNP transistor simultaneously. In the lateral structure, the semiconductor layer usually comprises the base, with the emitter and collector regions both located in the base but spaced apart. Both the emitter and collector regions of a lateral PNP transistor can be formed during the diffusion steps used to form the base region of the double-diffused NPN transistor. Therefore, there are no high temperature processing steps after the formation of the NPN transistor. The lateral PNP transistors formed by this process suffer from two major problems which are the beta of the device fabricated is very low and the beta falls off rapidly with increase in the emitter current. J. L. Dunkley et al U.S. Pat. No. 3,971,059, illustrates the formation of complementary devices of vertical NPN transistors and lateral PNP transistors.

D. W. Oberlin et al, U.S. Pat. No. 3,611,067, and J. D. Daughton, IBM TDB Vol. 15, No. 1, June 1972, pg. 261 have taught the use of Schottky Barrier collectors in PNP device structures to overcome some of the difficulties of the prior art. Oberlin et al utilizes a double-diffused NPN transistor and a PNP transistor with vertical structure which includes a diffused emitter, an epitaxial base and Schottky Barrier collector. The requirement for the epitaxial grown base in the Oberlin et al structure severely complicates the process and produces problems involving the growth of polysilicon over other surfaces of his structure during the epitaxial monocrystalline growth of the base, causes movement of the other diffused regions during the high temperature epitaxial growth and otherwise causes the PNP transistor gain and frequency responses to be adversely affected. The Daughton TDB article would have a PNP transistor of poor operating characteristics, at best, due to the substantial outdiffusion of the boron buried emitter region 12 during epitaxial growth. It would be expected that the boron would move rapidly both laterally and vertically to increase the size of the compensated pocket laterally and vertically reach the surface and affect the emitter of the collector of the PNP device.

The I. E. Magdo et al U.S. Pat. No. 3,861,968; Schmitz et al U.S. Pat. No. 3,930,909 and S. Weathersby, Jr. et al U.S. Pat. No. 3,999,080, all show complementary PNP and NPN transistors. They are, however, of general interest because while they show the complementary transistors, they involve rather complex fabrication methods which have decided disadvantages for practical usage. Castrucci et al U.S. Pat. No. 3,648,130;

Berger et al U.S. Pat. No. 3,922,565; and Chang et al U.S. Pat. No. 4,005,469, each suggest the use of a Schottky Barrier collector contact for integrated circuit transistors but do not describe the solution to the problems of vertical PNP and NPN integrated structures.

SUMMARY OF THE PRESENT INVENTION

In accordance with the present invention, a method for fabricating vertical NPN and PNP semiconductor devices on the same semiconductor body is described. The process is begun by providing a monocrystalline silicon substrate and forming a pattern of N type conductivity regions in the substrate. An epitaxial layer is then grown on the surface of the substrate and the N regions move into the epitaxial layer to some extent. Isolated regions of monocrystalline silicon are formed in the said substrate having the epitaxial layer thereon wherein the subcollectors are within at least some of the isolated regions. The P based region in the NPN designated regions and a P reach-through in the PNP designated regions is formed by diffusion or ion implantation techniques. This P type formation is done simultaneously in the NPN and PNP regions. The emitter region in the NPN region is formed simultaneously with the base contact region in the PNP regions. The P type emitter region in the PNP regions is formed by the ion implantation technique. This formation has the advantage of confining the P-type layer at a predetermined depth from the surface depending on the energy and a dosage of the implant. A Schottky Barrier collector contact is now formed in the PNP region. Electrical contacts are then made to both NPN and PNP transistor devices.

The use of the inverted vertical PNP with an ion implanted buried emitter region and Schottky Barrier collector contact region allows formation of the vertical complementary NPN and PNP transistor structure which do not have the disadvantages enumerated above as are present in the prior art structures. The formation of the ion implanted buried emitter and Schottky Barrier collector can be done at relatively low temperatures in comparison to prior art processing which do not adversely affect the previously formed transistor elements. The present structure has good gain characteristics and very low collector resistance. The collector-base junction is a Schottky junction and will not exhibit the usual saturation characteristics. The collector will not inject minority carriers into the base and thus this device will have high performance with much less storage effects than regular PNP transistor.

The resulting structure of the aforementioned method is a vertical NPN and PNP semiconductor device which is composed of a silicon semiconductor body that includes a substrate and an N type epitaxial layer thereover. The structure has regions of monocrystalline silicon isolated from one another by suitable isolating regions such as silicon dioxide. A buried N type region overlaps the juncture of the substrate and the epitaxial layer. This buried N type region is located in at least one of the regions of the monocrystalline silicon. An NPN transistor is located in the at least one of said monocrystalline silicon regions. This N type buried region forms the subcollector of the NPN transistor. A collector reach-through connection is provided for connecting the surface of the monocrystalline region with the buried subcollector region. A base region is spaced from the collector reach-through extending into the semiconductor body from the surface of the body. An emitter region is formed within the base region which extends from the surface of the body into the base region. A PNP transistor body is located in another of the isolated regions of monocrystalline silicon. This PNP transistor includes a buried P type emitter region connected to the surface of the monocrystalline by a P type reach-through. An N type base region is located above the emitter region. A Schottky Barrier collector is located at the surface of the monocrystalline silicon and within the base region. Electrical contacts are made to the emitter, base and collector of the NPN device and to the emitter, base and collector of the PNP transistor device.

It is preferred that the PNP transistor device also have a buried N type region under the PNP transistor. The buried N type region is connected to the surface of the monocrystalline silicon by a reach-through region. The buried N type region forms a PN junction with the substrate which is normally P type. This junction is biased to isolate the PNP transistor device from the substrate so that the formation of unwanted transistor action and stray capacitances are prevented.

It is sometimes also important to provide Schottky Barrier diodes either in isolated pockets from the PNP transistor device structure or within the same monocrystalline silicon isolated region. The Schottky Barrier diodes can be electrically connected with PNP devices so as to provide diode transistor gate structures wherein no clamp diode is required and practically zero collector resistance is found.

DESCRIPTION OF THE PREFERRED EMBODIMENTS

Referring now more particularly to FIGS. 1–10, the manufacturing steps for one form of the invention involves starting with the wafer or substrate 10 of P- silicon monocrystalline material. The substrate 10 is fabricated, for example, by pulling a monocrystalline rod from a suitable melt containing a P-type material such as boron and using a seed crystal having a <100> crystallographic orientation. The resulting rod is then sliced into very thin wafers which also have the surface crystallographic orientation of <100>. The P- silicon wafer has preferably a resistivity of 10–20 ohms centimeter.

Figure 1:
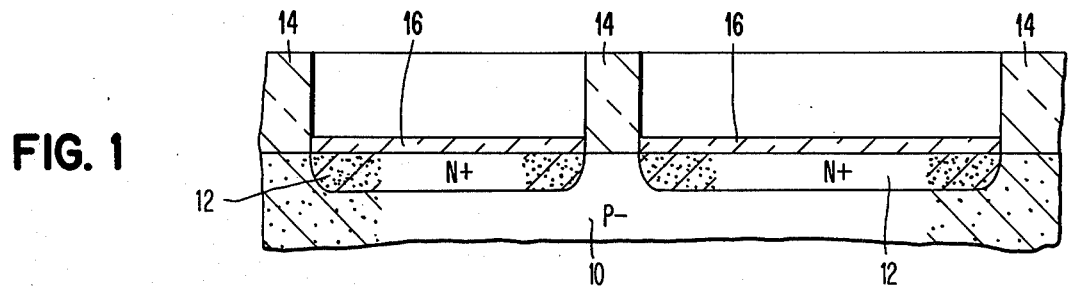
FIGS. 1–10 illustrate the method of fabricating one form of the vertical NPN and PNP structure of the present invention.
Figure 2:
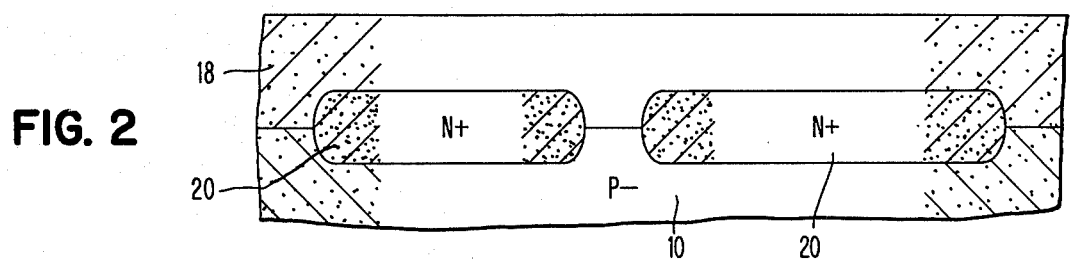
Figure 3:
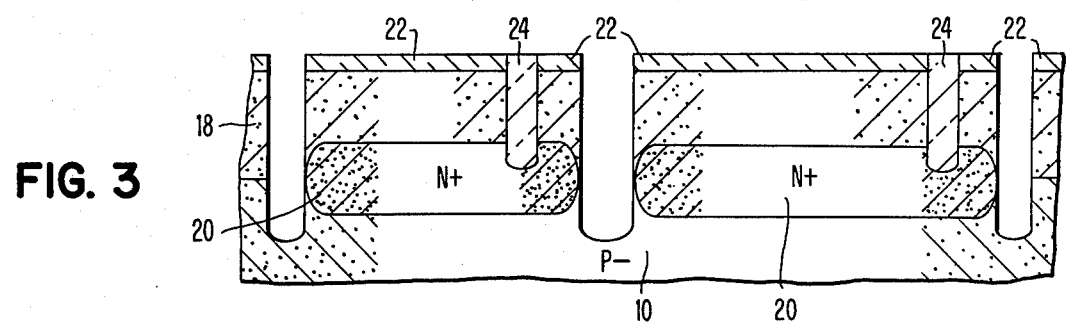

Referring now to FIG. 1, regions 12 of conductivity different from the substrate are then formed in the substrate 10. The region is preferably formed by ion implantation techniques but could alternatively be formed by the conventional diffusion processes. These regions 12 are formed by first, in the case of the silicon substrate, obtaining an insulating layer 14 of silicon dioxide on the semiconductor surface by thermal oxidation. The preferred thickness of the silicon dioxide is 3000 Angstroms. Openings are made in the thermal silicon dioxide layer by conventional photolithography and etching techniques. Silicon dioxide layer 16 is now grown in the openings in a thickness of about 250 to 300 Å by either thermal or pyrolytic techniques. This thickness acts as a screen for the subsequent ion implantation step. The oxidized silicon wafer is then positioned in an ion implantation apparatus and subjected to arsenic ions at 50 KeV and $1 \times 10^{16}$ atoms/cm$^2$ dosage for sufficient period of time to obtain a N+ layer 12 having range of implantation, Rp,=320 Å and sigma $\sigma$=118 Å to produce a buried layer with sheet resistance of 8-10 ohms/square after the following annealing cycle. The structure is removed from the ion implanting apparatus and placed into a suitable heating apparatus wherein the ion implanted layer is heated at approximately 1100° C. for 5 minutes in oxygen, then 70 minutes in argon, 55 minutes in steam, and 5 minutes in oxygen. The effect of this heat treatment is to drive the arsenic further into the P-substrate and the further oxidation of the surface. The silicon dioxide surface layers 14, 16 are then removed by a suitable etching procedure.

The structure is then placed in an epitaxial growth chamber wherein an epitaxial layer 18 is grown on the surface of the substrate 10, 12. The epitaxial layer may be any desired thickness, however, for the purpose of high performance device of the type involved in the present invention, the thickness should be less than about 2 microns. The preferred thickness of the epitaxial layer is about 1.2 micrometers. Layer 18 is grown onto the substrate 10, 12 by conventional techniques such as the use of SiCl$_4$/H$_2$ or SiH$_4$/H$_2$ mixtures of about 1000° to 1200° C. During the epitaxial growth the dopant in layer 12 moves into the epitaxial layer. This results in the layer 20 of FIG. 2 portions of which will serve as subcollector for the NPN transistor and/or PN junction isolation region for the PNP transistor to be formed by the process of FIGS. 1–10.

The next series of steps is directed to the technique for reactive ion etching of the silicon structure. A silicon dioxide layer 22 is formed by conventional techniques of either thermal growth at a temperature of 970° C. in wet or dry oxygen ambient or by chemical vapor deposition. Other mask materials can also be used such as silicon nitride and aluminum oxide or combinations thereof. It is preferred that a 1000 to 3000 Å silicon dioxide coating be formed by a chemical vapor deposition of silane and N$_2$O at 800° C. The initial recess oxidation step is directed to the formation of the base to subcollector reach-through isolation regions for the NPN and the PNP transistor to buried PN junction isolation regions. Suitable openings are formed by conventional photolithography and etching techniques in the silicon dioxide 22 where the isolation regions are to be formed. The structure is then put into a silicon reactive ion etching ambient. The process for this reactive ion etching may be more fully understood by reference to the J. N. Harvilchuck et al patent application Ser. No. 594,413, filed July 9, 1975, for "Reactive Ion Etching of Silicon". The RF induced plasma is reactive chlorine, bromine or iodine specie as specified in the Harvilchuck et al patent application. The thickness of the masking layer is between 2000-20,000 Angstroms, the exact thickness depending on the depth requirement of the silicon groove. A precise description of the RF discharge apparatus is given in the beforementioned patent application. The reactive ion etch or plasma ambient is preferably a combination of an inert gas such as argon and a chlorine specie. Application of suitable power is in the order of about 0.1-0.75 watts/cm$^2$ from an RF voltage source which produces sufficient power density to cause the reactive ion etching operation of silicon to be carried out at the suitable rate. The desired result of the etching is the shallow opening wherein the opening or channel at least partially penetrates through the N+ region 20.

The second silicon reactive ion etching procedure is to form the deep isolation regions between the regions of monocrystalline silicon. The silicon dioxode coating 22 is removed by conventional etching techniques. Another layer of silicon dioxide is formed on the surface which is preferably by pyrolytic deposition of silane and N$_2$O at 800° C. of a thickness of 0.6 to 0.8 micrometers. The opening is now filled with pyrolytic silicon dioxide during the deposition to form the isolating regions 24. Openings are now formed in the new silicon dioxide coating by conventional photolithography and etching techniques. The locations of the openings are where the desired dielectric isolation regions are to be formed which will isolate regions of monocrystalline silicon. The structure is now placed in the reactive ion etching ambient as described in the previous paragraph. Reactive ion etching of the silicon occurs through the openings to the desired depth. It is preferred that the openings extend through the N+ region 20 into the substrate region 10. The preferred process for forming the channels or openings by reactive ion etching is given in the patent application Ser. No. 824,361, filed Aug. 15, 1977 to "Method for Forming Isolated Regions of Silicon" by J. A. Bondur and H. B. Pogge.

The next step in the process is to thermally oxidize the openings or channels by subjecting the body to an oxidation ambient which may be for example 970° C. in wet oxygen. The body is subjected to the ambient for about 10 to 30 minutes to produce the preferred silicon dioxide thickness within the opening or channel between about 500-2000 Angstroms. The purpose of the thermal oxide is to assure good silicon dioxide interface properties, the qualities of which are usually not good with chemical vapor deposited dielectric material. Good quality dielectric material is necessary to permit the subsequent abutting of diffused junctions against the dielectric isolation. The complete filling of the opening with a suitable dielectric material is accomplished using vapor deposited silicon dioxide. The details of this process is described in the beforementioned Bondur et al patent application.

It may be preferred in some instances, prior to pyrolytic deposition step to ion implant boron ions through the bottom of the oxide at the bottom of the channel. This causes the formation of the P+ region underneath the isolation region which prevents the P-region under the isolation region from inverting to an N type material.

The pyrolytic silicon dioxide is deposited in a thickness of preferably 2 to 3 micrometers. The preferred filling process is a chemical vapor deposition of silicon dioxide using gas mixtures of CO$_2$/SiH$_4$/N$_4$ or N$_2$O/SiH$_4$/N$_2$ between 800° and 1000° C. The typical deposition rate is to the order of 50-100 Angstroms per minute.

The next step is the reactive ion etching of the chemical vapor deposited silicon dioxide layer to remove excess silicon dioxide from the surface. The system used for this process would be of the low pressure sputter etch type system with the wafer positioned on a silicon cathode cover plate. A fluorinated hydrocarbon such as CF$_4$ would be used as an etchant so that an SiO$_2$/Si ratio of approximately 1:1 results. The gas pressure could run from 10 to 70 micrometers with gas flow rates of 2 to 50 cc/min. The RF power level would run from 0.1 watts/cm$^2$.

Figure 4:
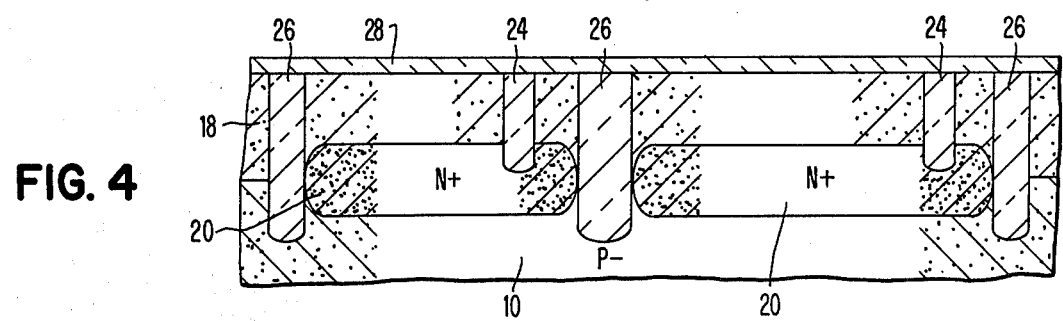

FIG. 4 now shows the complete isolation of the desired monocrystalline silicon regions by means of dielectric isolation regions 26. The surface of the body is reoxidized by growth of 0.3 to 0.5 microns of thermal oxide to bring the silicon dioxide layer 28 to the desired thickness.

Figure 5:
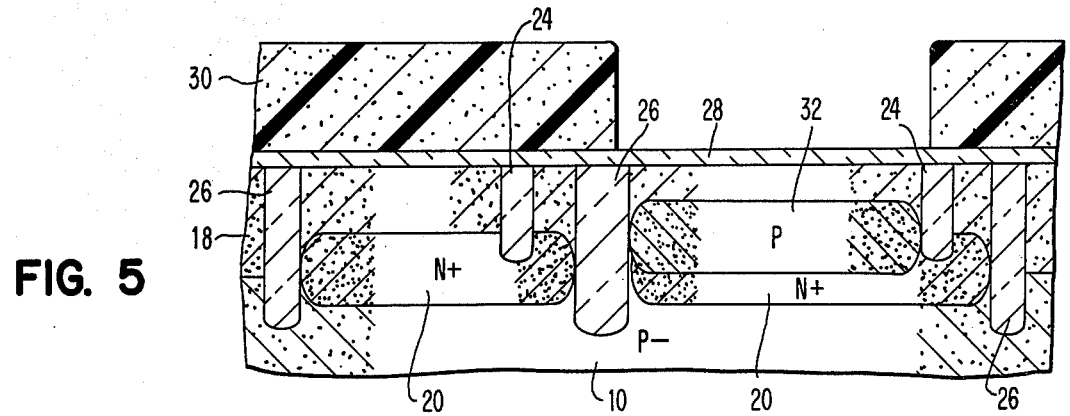

Referring now to FIG. 5, the buried emitter implant for the PNP emitter is accomplished. Photolithography and etching techniques are utilized to expose and develop the photoresist pattern 30 and then remove portions of the photoresist areas to expose the regions wherein P+ type ion implantation is to be accomplished. The structure is then placed in a suitable ion implantation apparatus wherein a boron ion implantation is accomplished using 500 KeV and $5 \times 10^{14}$ atoms/cm$^2$. It should be noted that the thin oxide coating of 250 to 500 Angstrom units 28 is allowed to remain on the surface of the structure. This silicon dioxide coating has the function of a screen for the ion implantation step. The photoresist layer 30 is removed. The result of the process is the P type buried emitter 32.

Figure 6:
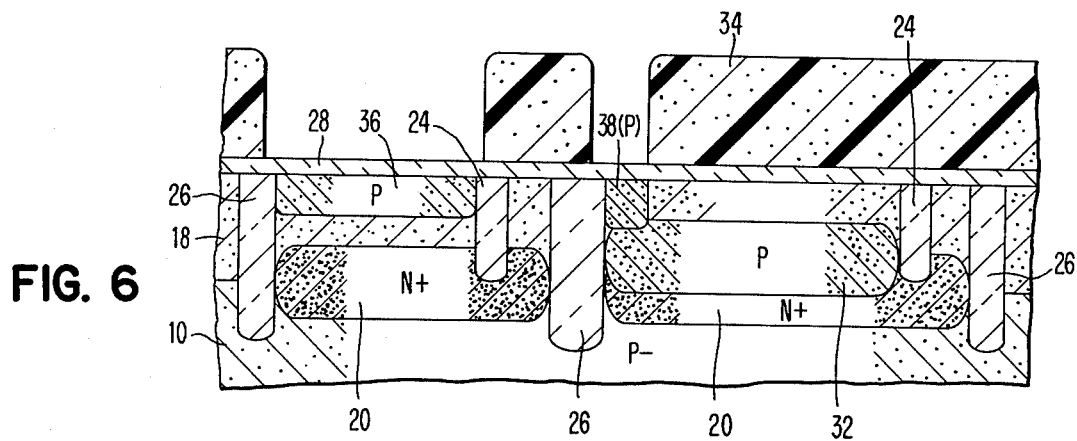

Referring now to FIG. 6, the NPN base and emitter reach-through diffusion for the PNP device are formed. This is accomplished by applying a simple photoresist 34, exposing and developing the photoresist to expose the regions which are to be the base regions of the NPN transistor and the P reach-through of the PNP transistor through the photoresist. The structure is again placed in the suitable ion implantation apparatus and a boron ion implantation applied to the surface of the structure using 150 KeV and a disage of $5 \times 10^{12}$ cm$^{-2}$. The photoresist layer 34 is removed. Subsequent high temperature processing step will act as an annealing cycle for this step. The structure now has a base region 36 and a emitter reach-through region 38.

Figure 7:
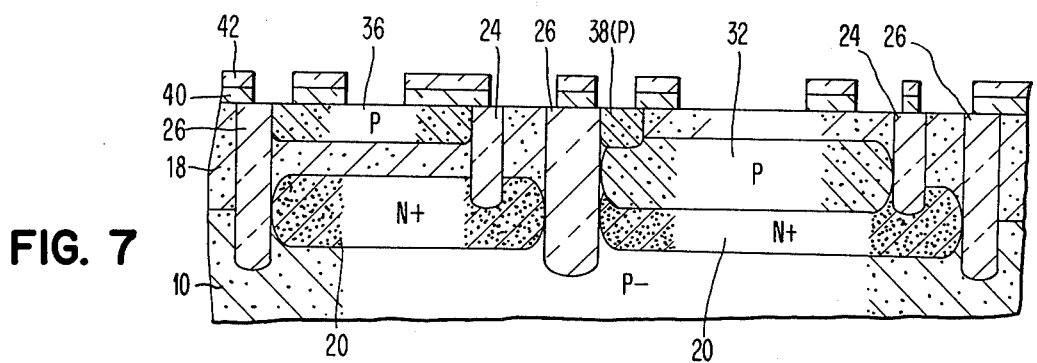
Figure 8:
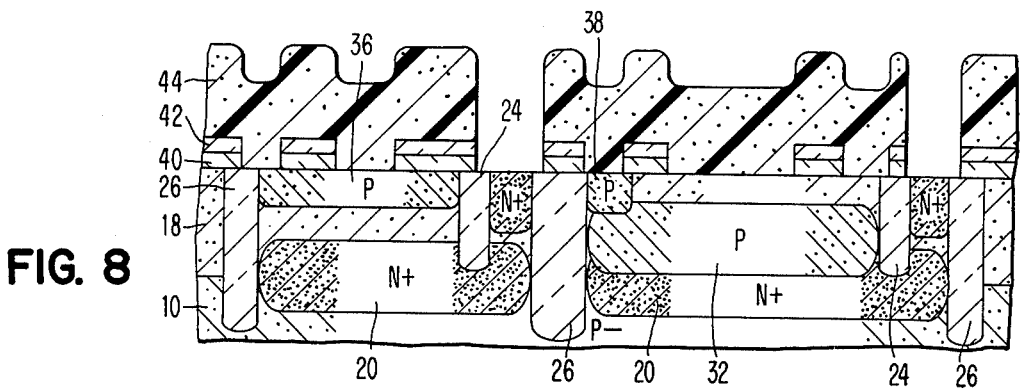
Figure 9:
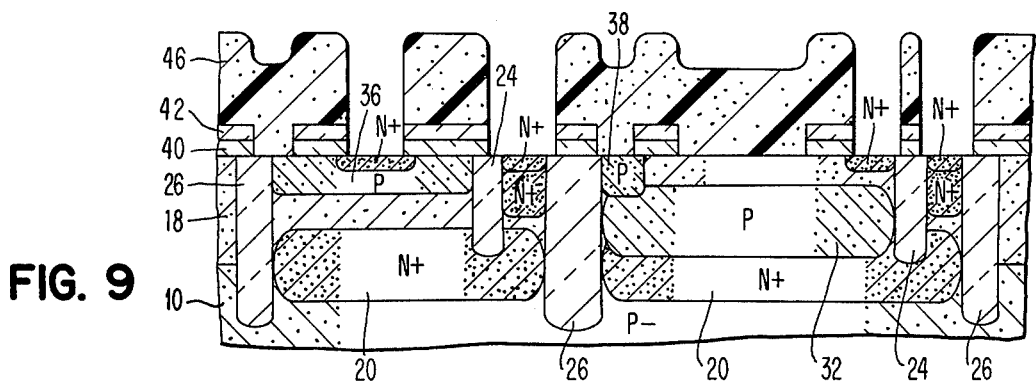

Referring now to FIG. 7, the silicon dioxide layer 28 is removed using a suitable etchant. A layer 40 of 800–1000 Angstroms of silicon dioxide is thermally grown by use of wet oxygen at approximately 970° C. A silicon nitride layer 42 of 800 Å to 1000 Å is formed by a chemical vapor deposition process which is deposited from a mixture of silane and ammonia in a nitrogen carrier gas at 800° C. A chemical vapor deposition layer (not shown) of 800–1000 Å silicon dioxide is formed by using silane and N$_2$O in a nitrogen ambient. Conventional photolithography and etching techniques are utilized to open the desired areas in the pyrolytic silicon dioxide mask which in turn is used to etch the desired areas in the silicon nitride layer 42. The pyrolytic silicon dioxide mask is then removed and the silicon nitride layer 42 is utilized as the mask for etching the silicon dioxide layer 40 down to the silicon surface. The areas now exposed are the electrical contact openings, the NPN emitter diffusion openings, and the N+ reach-through regions in the NPN and PNP structures. A one-micron photoresist layer is applied to the surface, exposed, developed and etched to form photoresist mask 44, for the reach-through implants. The structure is ion implanted in a suitable ion implantation apparatus with phosphorus of a dosage of $1 \times 10^{15}$ cm$^{-2}$ at a power of 200 KeV. The photoresist layer 44 is then removed.

Another one-micron photoresist is applied, exposed and developed for use as a photoresist emitter mask 46. Openings are also present in the collector reach-through for the NPN, the base contact for the PNP and the N type reach-through in the PNP. The structure is placed in a suitable ion implantation apparatus wherein arsenic ions are implanted at a dosage of $3 \times 10^{15}$ cm$^{-2}$ at a power of 40 KeV. Photoresist layer 46 is then removed by suitable etching techniques. The wafers are annealing at 1000° C. for 20–30 minutes in a nitrogen ambient.

A suitable ohmic contact metal is then evaporated or deposited by other means onto the upper surface of the structure. Typical contact material is aluminum or aluminum-copper. However, other well known materials in the art can be used such as platinum, paladium, molybdenum, and so forth. Photolithography and etching techniques are utilized for the desired conductive lines on the surface of the semiconductor structure from the blanket metal layer.

Figure 10:
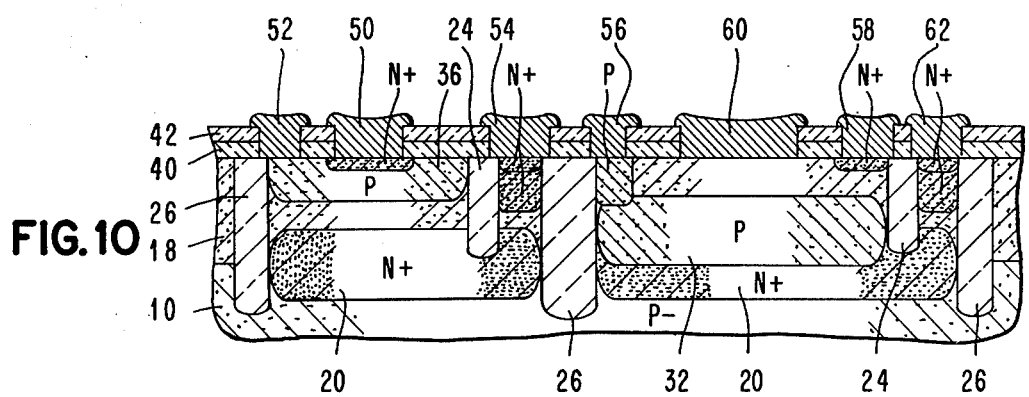

FIG. 10 illustrates the completed NPN transistor and PNP transistor structure by the present process wherein the NPN emitter electrical contact is 50, the base contact 52 and the collector reach-through contact 54. The PNP reach-through emitter contact is 56, the base contact is 78 and the Schottky Barrier collector contact 60 and the PN isolation contact is 62.

Figure 11:
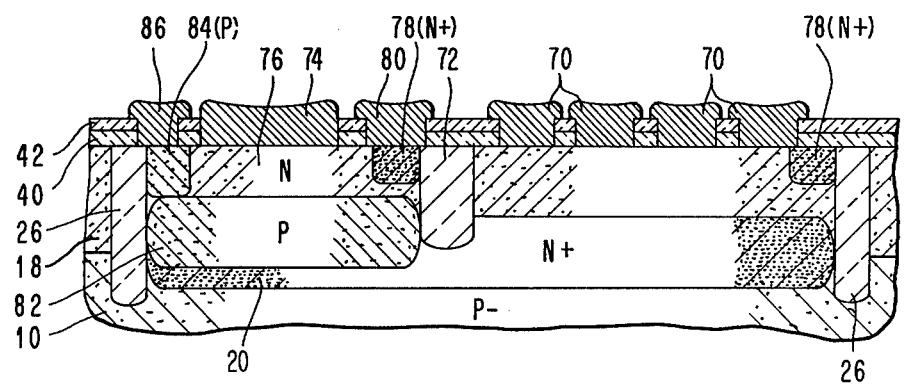
FIGS. 11 and 12 illustrate two forms of the integrated PNP and Schottky Barrier diode structures of the present invention.
Figure 12:
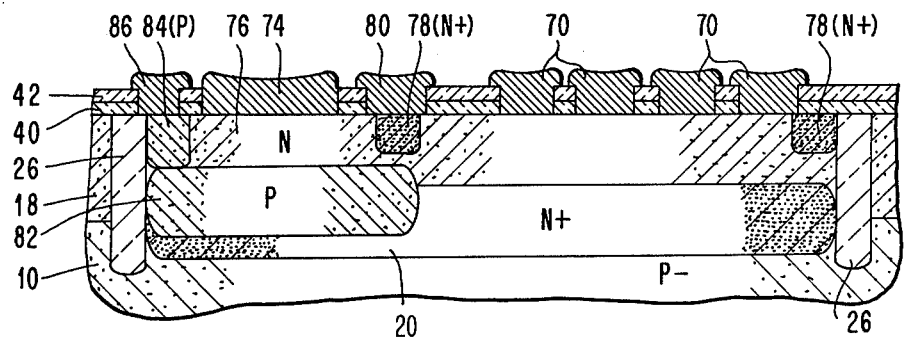

Referring now to FIGS. 11 and 12, there is shown the combination of a PNP transistor device with Schottky Barrier diodes 70. The PNP device is composed of Schottky Barrier collector 74, base region 76, N+ base contact 78, base electrode 80, emitter region 82, emitter reach-through 84 and emitter electrode 86. The difference between FIGS. 11 and 12 is that in the case of FIG. 11 there is an isolation region 72 which reaches into the buried N+ region 74 and partially isolates the surface regions of the Schottky Barrier diode areas from the surface region of the PNP transistor. This has the advantage of producing an isolated PNP device.

The Schottky Barrier diodes 70 are fabricated in the following manner: The contact area for Schottky Barrier collector 74 is opened first and a metal such as Pt, Pd, etc., which gives a high barrier ($\phi$) with N type silicon is deposited thereover. The wafers are sintered in an inert ambient at 450°–550° C. for 15–30 minutes to form PtSi, PdSi etc. in the exposed silicon area. The metal over the oxide is removed and contact areas for diodes 70 are now opened with a suitable etchant. Now a metal like Ti, Ta, Ti-W, etc. which gives low barrier ($\phi$) on N-type silicon is evaporated over the wafer. On top of this thin layer, usually 2000–5000 Å, a thick layer of a current carrying metallurgy such as Al-Cu is evaporated. Metal patterns are etched and the wafers are again sintered in an inert ambient at 400°–500° C. for 20–30 minutes. Now contacts of the type 71 produce high barrier Schottky diodes, $\phi$ about 0.82 ev and contacts of the type to produce low barrier Schottky diodes, $\phi$ about 0.5 ev.

Figure 13:
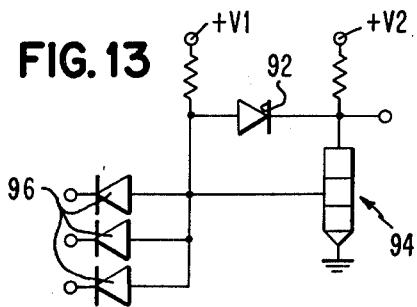
FIG. 13 illustrates a conventional diode-transistor logic circuit.

The conventional diode transistor logic (DTL) is shown in FIG. 13. 92 is conventional high barrier Schottky diode clamp to prevent saturation of the transistor 94. The input diodes 96 are low barrier diodes.

Figure 14:
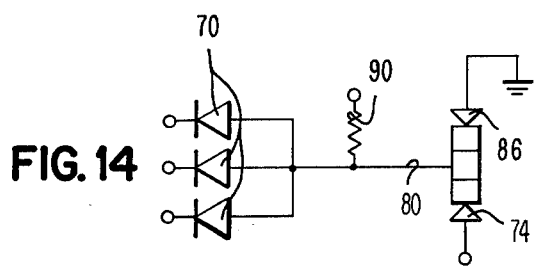
FIG. 14 illustrates the equivalent circuit of the PNP and Schottky Barrier diode combination illustrated in FIGS. 11 or 12.

FIG. 14 shows the equivalent circuit for the Schottky Barrier diode PNP transistor combination of FIGS. 11 and 12. The resistor 90 is an external resistor to the FIGS. 11 and 12. In the present invention, the low barrier diodes 70 and Schottky collector PNP transistor form the diode-transistor logic. The Schottky collector PNP does not go into saturation in the conventional sense and there is no need for a clamping diode. This enables high packing density of this type of diode-transistor logic.

While the invention has been particularly shown and described with reference to the preferred embodiments thereof, it will be understood by those skilled in the art that various changes in form and detail may be made therein without departing from the spirit and scope of the invention.

What is claimed is:

1. A verticle NPN and PNP semiconductor device comprising:
   a silicon semiconductor body composed of a substrate and an N-type epitaxial layer having regions of monocrystalline silicon isolated from one another by isolating regions;
   a buried N-type region overlapping the juncture of said substrate and said epitaxial layer and located in at least one of said regions of monocrystalline silicon;
   an NPN device located in said at least one of said regions of monocrystalline silicon which includes a collector reach-through connecting the surface of the monocrystalline silicon with said buried region, a base region spaced from said collector reach-through extending into said body from the surface of said body, and an emitter region within said base region extending from the surface of said body into said base region;
   a PNP device located in one of said regions of monocrystalline silicon other than or containing a NPN device which includes a buried P-type emitter region connected to the surface of the monocrystalline silicon by a P-type reach-through, an N type base region above the said emitter region and a Schottky Barrier collector at the said surface of the monocrystalline silicon and within said base region; and
   electrical contacts to said emitter, base and collector of said NPN device and to said emitter, base and collector of said PNP device.

2. The device of claim 1 wherein said isolating regions are composed of dielectric material.

3. The device of claim 2 wherein said dielectric material is silicon dioxide.

4. The device of claim 1 wherein the said Schottky Barrier collector is composed of platinum silicide.

5. The device of claim 10 wherein the said buried P-type emitter region is at a depth of 0.2 to 0.5 microns below the said surface.

6. The device of claim 1 wherein there is a said buried N-type region under said PNP device, said N-type region is connection to said surface of the monocrystalline silicon by a reach-through region, said N-type region forms a PN junction with said substrate which is P-type and said junction is so biased to isolate said PNP device from said substrate.

7. A vertical PNP semiconductor device comprising:
   a silicon semiconductor body composed of a substrate and an N-type epitaxial layer having regions of monocrystalline silicon isolated from one another by isolating regions;
   a buried N-type region overlapping the juncture of said substrate and said epitaxial layer and located in at least one of said regions of monocrystalline silicon;
   a PNP device located in one of said regions of monocrystalline silicon which includes a buried P-type emitter region above said buried N-type region connected to the surface of the monocrystalline silicon by a P-type reach-through, an N-type base region above the said emitter region and a Schottky Barrier collector at the said surface of the monocrystalline silicon and within said base region; and
   electrical contacts to said emitter, base and collector of said PNP device.

8. The device of claim 7 wherein the said isolating regions are composed of silicon dioxde.

9. The device of claim 7 wherein said buried N-type region is connected to the surface of the said monocrystalline silicon by a reach-through region, said N-type region forms a PN junction with said substrate which is P-type and said junction is so biased to isolate said PNP device from said substrate.

10. The device of claim 7 wherein Schottky Barrier diodes are formed in said semiconductor body which are connected to form a circuit with said PNP device.

11. The device of claim 10 wherein said Schottky Barrier diodes are composed of Ti/Al+Cu and said Schottky Barrier collectors are composed of PtSi/Ti/Al+Cu.

12. An integrated diode transistor logic circuit comprising:
    a PNP transistor having an emitter, a base and a Schottky Barrier collector; Schottky Barrier diodes connected in parallel; and
    means for connecting said diodes to the base of said PNP transistor.

* * * * *